US007166999B2

(12) United States Patent
Duensing (10) Patent No.: US 7,166,999 B2
(45) Date of Patent: Jan. 23, 2007

(54) METHOD AND APPARATUS FOR SERIAL ARRAY EXCITATION FOR HIGH FIELD MAGNETIC RESONANCE IMAGING

(75) Inventor: G. Randy Duensing, Gainesville, FL (US)

(73) Assignee: Invivo Corporation, Gainesville, FL (US)

( * ) Notice: Subject to any disclaimer, the term of this patent is extended or adjusted under 35 U.S.C. 154(b) by 0 days.

(21) Appl. No.: 11/074,964

(22) Filed: Mar. 7, 2005

(65) Prior Publication Data
US 2005/0194975 A1     Sep. 8, 2005

Related U.S. Application Data

(60) Provisional application No. 60/550,875, filed on Mar. 5, 2004.

(51) Int. Cl.
*G01V 3/00*     (2006.01)
(52) U.S. Cl. ....................... 324/309; 324/307
(58) Field of Classification Search ............... 324/309, 324/307, 314, 312
See application file for complete search history.

(56) References Cited

U.S. PATENT DOCUMENTS

| | | | | |
|---|---|---|---|---|
| 4,682,112 A | * | 7/1987 | Beer .......................... | 324/322 |
| 4,689,563 A | * | 8/1987 | Bottomley et al. ......... | 324/309 |
| 4,825,162 A | * | 4/1989 | Roemer et al. ............. | 324/318 |
| 5,144,243 A | | 9/1992 | Nakabayashi et al. | |
| 5,572,130 A | | 11/1996 | Ratzel | |
| 6,192,263 B1 | * | 2/2001 | Ma ............................ | 600/410 |

2003/0020475 A1    1/2003   Leussler

FOREIGN PATENT DOCUMENTS

WO    WO 03/107027 A1    12/2003

OTHER PUBLICATIONS

Roemer PB, Edelstein WA, Hayes CE, Souza SP, Mueller OM,. "The NMR Phased Array". Magnetic Resonance in Medicine vol. 16, pp. 192-225 (1990).*
Katscher U et al. "Transmit SENSE". Magnetic Resonance in Medicine, Col. 49, pp. 144-150 (2003).*

(Continued)

*Primary Examiner*—Louis M. Arana
(74) *Attorney, Agent, or Firm*—Saliwanchik, Lloyd & Saliwanchik (57) ABSTRACT

The subject invention pertains to methods and apparatus for producing excitation for magnetic resonance imaging (MRI) from a plurality of local exciting elements such that each local exciting element's excitation is independent of the other local exciting elements' excitation. The methods and apparatus of the subject invention can be utilized in magnetic resonance imaging (MRI) and in magnetic resonance spectroscopy (MRS), where MRI produces a magnitude for each pixel that combines many frequency components, typically for magnitude images, and MRS produces a spectrum of outputs over a range of frequencies for each pixel, typically a spectral output. The subject method and apparatus can be utilized for exciting proton, and/or other imaging materials relating to spin magnetization, such as, but not limited to, phosphorous, carbon, and fluorine. In a specific embodiment, the subject invention achieves the independence of the local exciting elements' excitations via serial means, such that excitation is produced by each local exciting element at a different time than the other local exiting elements.

29 Claims, 4 Drawing Sheets

OTHER PUBLICATIONS

Beck B et al. "Progress in high field MRI at the University of Florida". Magnetic Resonance Materials in Physics, Biology and Medicone. vol. 13, pp. 152-157 (2002).*

Beck, B. L. et al. "Observation of Significant Signal Voids in Images of Large Biological Samples at 11.1 T" *Magnetic Resonance in Medicine*, 2004, pp. 1103-1107, vol. 51.

Bottomley, P. A. et al. "Phosphate Metabolite Imaging and Concentration Measurements in Human Heart by Nuclear Magnetic Resonance" *Magnetic Resonance in Medicine*, 1990, pp. 425-434, vol. 14.

Collins, C. M. et al. "SAR and $B_1$ Field Distributions in a Heterogeneous Human Head Model within a Birdcage Coil" *Magnetic Resonance in Medicine*, 1998, pp. 847-856, vol. 40.

Hayes, C. E. et al. "Noise Correlations in Data Simultaneously Acquired from Multiple Surface Coil Arrays" *Magnetic Resonance in Medicine*, 1990, pp. 181-191, vol. 16.

Hoult, D. I. et al. "Sensitivity and Power Deposition in a High-Field Imaging Experiment" *Journal of Magnetic Resonance Imaging*, 2000, pp. 46-67, vol. 12.

Ibrahim, T.S. et al. "Dielectric resonances and $B_1$ field inhomogenetiy in UHFMRI: computational analysis and experimental findings" *Magnetic Resonance Imaging*, 2001, pp. 219-226, vol. 19.

Katscher, U. et al. "Transmit SENSE" *Magnetic Resonance in Medicine*, 2003, pp. 144-150, vol. 49.

King, S. B. et al. "MR Spectroscopy Using Multi-Ring Surface Coils" *Magnetic Resonance in Medicine*, 1999, pp. 655-664, vol. 42.

Suits, B. H. et al. "Surface and Gradiometer Coils near a Conducting Body: The Lift-off Effect" *Journal of Magnetic Resonance*, 1998, pp. 373-379, vol. 135.

Vaughan, J. T. et al. "7T vs. 4T: RF Power, Homogeneity, and Signal-to-Noise Comparison in Head Images" *Magnetic Resonance in Medicine*, 2001, pp. 24-30, vol. 46.

* cited by examiner

METHOD AND APPARATUS FOR SERIAL ARRAY EXCITATION FOR HIGH FIELD MAGNETIC RESONANCE IMAGING

CROSS-REFERENCE TO RELATED APPLICATION(S)

The present application claims benefit of U.S. provisional patent application Ser. No. 60/550,875, filed Mar. 5, 2004, which is hereby incorporated by reference herein in its entirety, including any figures, tables, or drawings.

BACKGROUND OF INVENTION

Because of the trend towards higher attainable signal-to-noise ratio (SNR) with increasing magnetic field strength in Magnetic Resonance Imaging (MRI), magnet field strengths have increased to 9.4 Tesla state-of-the-art human research systems, and considerably higher for small animal systems. As the field strength increases, the Larmor frequency of the spin precession increases linearly with the relationship f(MHz)=42.6 MHz/Tesla. For MRI systems operated at approximately 3 Tesla (T), or above, the Larmor frequency is associated with wavelengths in the biological sample that are shorter than objects to be imaged. Accordingly, at magnetic field strengths of, for example, 3T and above, the homogeneity of transmit excitation in magnetic resonance imaging (MRI) is poor for samples the size of the human torso. This is a result of the standing waves created in the tissue by the coil conductors or array elements. This results in a somewhat new regime for very high field MRI. Heretofore, this issue has typically been addressed by optimizing the distribution of current on the coil conductors or array elements to create the best possible standing wave excitation pattern. The result has been that standard MRI methods extended to this short wavelength regime have produced undesirable outcomes (Collins et al., Magn Reson Med, 40: 847–856 (1998); Hoult et al., Magn Reson Imaging, 12: 46–67 (2000); Ibrahim et al, Magn Reson Imaging, 19: 219–226 (2001); Vaughan et al., Magn Reson Med, 46: 24–30 (2001). The relatively short wavelengths associated with standard MRI methods make it virtually impossible to produce an external source of spin excitation that has sufficient uniformity to obtain a relatively uniform image of the biological sample (Beck et al., Magn Reson Med, 51: 1103–1107 (2004); Hoult, D. I. J. Magn. Reson. Imaging 12: 46–67, (2000)).

Multiple receivers can create independence between receive channels by allowing phasing and amplitude adjustment to be performed arbitrarily after acquisition and using different effective coefficients for all positions. However, merely using multiple amplifiers or a power splitter does not create the needed independence of the local exciting elements because the local elements all transmit simultaneously so that the phase relationship between each element's field is fixed.

The standard assumption of optimization would be to drive multiple coils at prescribed amplitudes and phases, all with the same waveform. Additionally, transmit SENSE has been described and is designed to shorten the transmit period by using waveforms with different spectral characteristics.

Large $B_1$ inhomogeneity can lead to non-uniform flip angles and non-uniform power absorption throughout the sample, and/or actual signal voids, or black areas, in the image. It is important to note that the images acquired in (Beck et al., Magn Reson Med, 51: 1103–1107 (2004)) were done with a multi-leg volume coil driven in quadrature, a fairly standard setup. In this case, the source of cancellations in the excitation field is due to the superposition of the fields of multiple sources around the object and that the fields have different phases as they extend across the sample.

Therefore, there is a need for a new technique for image creation for very high field magnetic resonance imaging systems.

BRIEF DESCRIPTION OF DRAWINGS

FIGS. 4A–4H show eight images associated with each position around the sample shown in FIGS. 3A and 3B, where

DETAILED DISCLOSURE

The subject invention pertains to methods and apparatus for producing excitation for magnetic resonance imaging (MRI) from a plurality of local exciting elements such that each local exciting element's excitation is independent of the other local exciting elements' excitation. The methods and apparatus of the subject invention can be utilized in magnetic resonance imaging (MRI) and in magnetic resonance spectroscopy (MRS), where MRI produces a magnitude for each pixel that combines many frequency components, typically for magnitude images, and MRS produces a spectrum of outputs over a range of frequencies for each pixel, typically a spectral output. The subject method and apparatus can be utilized for exciting proton, and/or other imaging materials relating to spin magnetization, such as, but not limited to, phosphorous, carbon, and fluorine. In a specific embodiment, the subject invention achieves the independence of the local exciting elements' excitations via serial means, such that excitation is produced by each local exciting element at a different time than the other local exiting elements. By transmitting with different elements at different times standing waves are not created, but, instead, each element's excitation is independent of a later or earlier element's excitation. In this way, the flip angle, or the angle by which the magnetization is tilted away from the axis of the main magnetic field, can be increased by the excitation of another local exciting element during a subsequent corresponding excitation period, but the magnetic field of this subsequent excitation does not add to the previous excitation field, because the excitations are not simultaneous.

In a specific embodiment, the subject method can be utilized in MRI systems using a magnetic field having a magnetic field strength of 3T and above; in a further embodiment using a magnetic field strength of 5T and above; in an even further embodiment using a magnetic field strength of 7T and above; and in yet a further embodiment using a magnetic field strength of 11 T and above. For MRI systems having D<<λ, where D is the diameter, or width, of the region of interest and λ is representative of the wavelengths in the sample to be imaged, then simultaneous excitation of the sample by the local exciting elements does not typically suffer homogeneity problems from interference of the excitation from different exciting elements. Accordingly, benefits of the subject invention can be realized of a specific embodiment when D>λ, and in another specific embodiment when $$D > \frac{\lambda}{2}, \text{ where } \lambda \propto \frac{1}{f}(f \text{ (MHz)}) = 42.6\frac{MH}{T} \text{ and}$$

$$\lambda \propto \frac{1}{\sqrt{\varepsilon}} \text{ ($\varepsilon$ is the dielectric constant of the sample to be imaged).}$$

Accordingly, in a specific embodiment for imaging a human torso the subject invention is incorporated with an MRI system using a magnetic field $B_o \geq 3T$ and in another specific embodiment for imaging a human head the subject invention is incorporated with an MRI system using a magnetic field $B_o \geq 7T$.

In a specific embodiment, a plurality of separate images can be produced with a corresponding plurality of local exciting elements distributed around a volume and then the separate images can be combined to make a single image. A single image created from the plurality of separate images can be much more uniform than one created using the standard approach. However, producing a plurality of images and combining them to make one image can take more time and be less than optimally efficient in SNR/unit time. In an embodiment, the single image can be created using the values of the pixels from the plurality of images, where the values of the pixels from the plurality of images can have magnitude and/or phase, in a way that the phases of the pixels from the plurality of images do not interact. A single image can be created from the plurality of separate images in a way that prevents the phase information of the plurality of separate images from interacting by, for example, adding the magnitudes of the plurality of separate images for each pixel or taking the square root of the sum of the magnitudes squared of the plurality of separate images for each pixel. Additional, techniques for creating a single image from the plurality of separate images can also be implemented in accordance with the subject invention. In another specific embodiment, each pixel of the single image can be the value of the pixel's magnitude and phase, from one of the plurality of separate images such that each pixel of the single image has a magnitude and phase, but the phase values of pixels from the plurality of separate images do not interact. An example of such an embodiment would be if a 45° slice of each of the images in FIGS. 4A–4H were combined into a single image, with magnitude and phase values for each pixel, where each pixel in the single image has the magnitude and phase value of the pixel in the corresponding 45° slice from one of FIGS. 4A–4H.

In another embodiment of the subject invention, a means for switching between coils during an excitation period can be incorporated. For example, 7T systems operate at 300 MHz and the length of the pulse of this RF excitation is approximately 1–2 ms. This provides plenty of time for switching between coils. This switching can be implemented in a number of ways, including the following examples.

a. In a specific embodiment, a means to switch between coils very fast can be utilized to force deviations from the desired bandwidth excitation to frequencies out of the range of the coil's coverage in the slice selection direction. Each coil's pulse can look like a naturally sampled sinc (or other envelope) and the result of the other coils' fields at alternate times can be designed to be small and/or out of band. An advantage of this approach is that no control from the MR system is required. A coil design in accordance with this embodiment can be used without regard to the particular sequences used for imaging. The power requirement can be higher than necessary because of out-of-band power that is deposited but is not helpful in the imaging sequence, and some errors in slice selection may occur.

b. In another specific embodiment, imaging techniques that have square pulses or other shapes that are not designed to excite a particular bandwidth in slice-select direction can be used. In this embodiment, the integral of the pulse is all that is important for flip angle selection and switching will not damage this in any way.

c. A further specific embodiment relates to multi-slice SENSE and/or transmit SENSE, in which the individual element waveforms can be controlled to excite multiple slices or slabs, and then knowledge of the sensitivity maps and waveforms can be used to invert to the desired slices.

In a further specific embodiment, one or more exciting coils can be physically moved during the transmit phase, so as to accomplish similar results as switching between multiple coils. For example, an exciting coil can transmit at a first position during a first period of time and then transmit at a second position during a second period of time.

In another embodiment, a technique can be incorporated for sweeping through phases/frequencies on individual exciting coils to produce net flip angles, with effective averaging over a range of phases, so that phase cancellations do not occur. This may also cost more power than required, because the fields would not optimally, continually flip spins coherently.

An embodiment of the subject invention can use multiple coil elements to improve uniformity of excitation, such that a first configuration of one or more coil elements are excited during a first period of time and a second configuration of one or more coil elements are excited during a second period of time. Each configuration of one or more coils can cover a different portion of the field of view. Of course, more configurations of one or more coil elements can also be used during different time periods. The configurations of one or more coil elements can be subsets of the coil elements in a coil configuration having a plurality of coil elements. In an embodiment, each subset of coil elements can be associated with a mode of the coil configuration having the plurality of coil elements. The excitation of two or more configurations of one or more coil elements that have non-overlapping, or substantially non-overlapping B1 profiles can be performed simultaneously, in accordance with an embodiment of the subject invention, as the B1 profiles of such excitation of the two or more configurations would not interfere with each other. In such an embodiment, the sum of the B1 profiles of the two or more configurations looks similar to the B1 profile of the simultaneous excitation of the two or more configurations.

The subject invention relates to the use of different time windows for excitation. This excitation during different time windows can involve different coils and/or different positions of a coil. The use of different time windows for excitation can reduce, or avoid interference of waves from the different coils and/or the coil at different positions within the sample. In this way, an embodiment of the subject invention can reduce, or avoid, interference of waves via non-simultaneity of the excitation. In a specific embodiment, the time difference between adjacent excitations is greater than or equal to $T_1$, where $T_1$ is the $T_1$ spin-lattice relaxation time constant of the sample. In another specific embodiment, the time difference between adjacent excitations is greater than or equal to $T_2$, where $T_2$ is the $T_2$ spin-spin relaxation time constant of the sample. In a specific embodiment, the excitations for a single image are conducted and then the excitation for another image are conducted. In another specific embodiment, the excitations relating to different images are time interlaced. In this way, the excitations can be conducted in an order that is convenient to the application.

Complete acquisitions can be combined together. Each coil or coil position can be used for an independent image. Combining independent images from the different coils will typically result in signal-to-noise (SNR) loss due to non-optimal flip angles occurring during some portion of the acquisition and overall longer acquisition time in order to obtain an acceptable image. In a specific embodiment, a rotation of one or more coils between acquisitions and/or switching of one or more coils between acquisitions can be implemented. In an embodiment, one or more coils that produce a non-uniform excite field can be utilized with the subject invention. In a specific embodiment, a loop or counter rotating coil (CRC) loop, which are inherently non-uniform through the sample, can be utilized. In additional embodiments, other coils can be utilized in accordance with the subject invention. In general, the flip angle can be optimized at one position in field of view, for example, at one radial depth of the field of view, but will not be optimal at all locations. One radial depth can be, for example, the center of the region of interest. Using a relatively uniform surface coil, such as a CRC or multi-ring, can allow optimization at the center of the field of view. In addition, if a near 90 degree GE sequence is employed, SNR loss can be reduced and, in some cases, forced to the periphery of the field of view.

In an embodiment, a square pulse excitation can be utilized. In this embodiment, the switching between coils or coil positions does not result in different waveforms at different locations, since there is no frequency selection occurring in this process. In an embodiment, the profile of the source coil can be adjusted to produce relatively close to the same flip angle at most locations. In an embodiment having a cylindrical field of view, each coil or coil position can contribute equally to the center of the cylinder, but contribute very differently at the periphery of the cylinder. The profile can be selected in conjunction with the number of positions to produce a good flip angle at most locations. In an embodiment utilizing a square pulse excitation, slice selection is not accomplished using the pulse shape. An extra dimension of phase encoding can be utilized, using RF receive encoding. In specific embodiments, polar, or pseudo-polar (Averbuch, et al, 2003), can be used for faster acquisitions.

As discussed above, each excitation can involve excitation of one or more coil elements to produce a certain B1 profile in the field of view. An image can be made for each of the excitation profiles. The received step of the process can utilize the same one or more coil elements used for excitation or can use another coil configuration. For enhanced performance it is usually desirable to use all of the coil elements that are available to receive. In a specific embodiment, each coil element of a plurality of coil elements is used during only one of the excitations. In another embodiment, the coil elements of a plurality of coil elements can be excited so as to produce modes.

In a specific embodiment, transmit SENSE can be used during excitation such that different coils and/or coil elements transmit different waveforms during excitation.

In an embodiment where one or more coils are sequentially excited and/or one or more coils are repositioned between excitations and shaped pulses are employed, then the slice selection profile can change for each position in the imaging plane field of view (FOV). The pulse shapes can be monitored and the excitation profiles obtained by, for example, measuring the excitation profiles, so as to obtain the actual pulse shape for every position. The Fourier Transform (FT) can then be used to obtain the slice selection profile. Using this pulse shape and slice selection profile information, and multiple slices, invertibility can be obtained in certain conditions. The center of the object typically has good slice selection. By design of the coil locations and profiles, easily invertible selection shapes can be chosen. In an embodiment, the excitation is switched fast enough so that the basic pulse shape frequencies are substantially lower than the switching frequencies. This can provide certain advantages. However, power can be lost to frequencies not of interest and, therefore specific absorption rate (SAR) can be higher than necessary.

In a specific embodiment, the excitation is switched from one coil to another and/or the coil position is changed between excitations between phase encode steps. This can lower SNR per unit time, but can allows faster, and possibly maximal, speed to be achieved. Sensitivity reference data can be taken for each receive coil with respect to each transmit coil location. The transmit part of the sensitivity is non-linear, except for small flip angle approximations, so different settings for transmit gain can change the sensitivity map to be used. In addition, a different power setting can be used for different coils to further optimize the process and/or allow faster speeds. Experiments suggest that speed-ups would be similar.

In an embodiment, n pulses in series, one each from each of n coils can be used during one standard transmit period, with each pulse being n times shorter and the slab excited being n times wider. The transmit sensitivity information can then be used to allow selection of any slice within this slab. The sum of these excitations can add to a narrow slice profile at the center with optimal flip angle. At the periphery, the flip angle can be approximately correct, but the weightings of the different slice profiles is different. In an embodiment, the slice profile can be known and can be the same thickness or thinner than the slab itself. If desired, optional subsequent scans can change the relative phases or amplitudes to obtain similar slice thickness for all locations throughout the slab. If only the central region is of interest, subsequent scans changing the relative phases or amplitudes can be left out of the process.

In an embodiment, separate acquisitions from a single coil excitation source that has a limited extent of field can be performed. An output image can be produced by, for example, adding the magnitudes of the acquired image data together or taking the square root of the sum of the squares of the images from the separate acquisitions.

EXAMPLE 1

Figure 1:
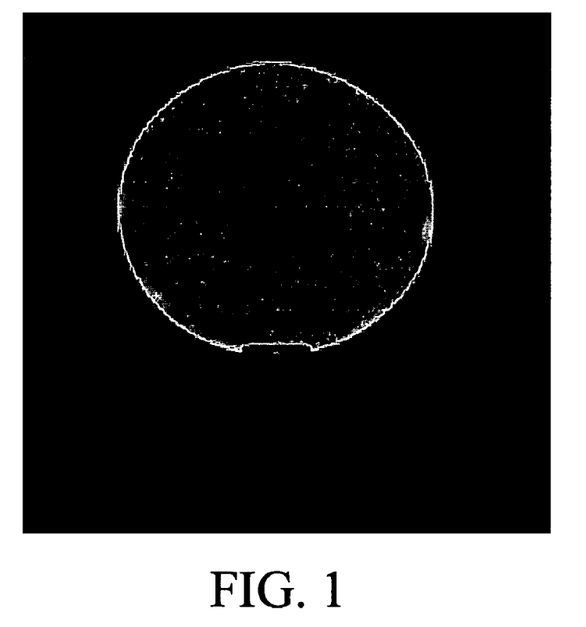
FIG. 1 shows a sum-of-square reconstruction image of a phantom based on 8 images, where each of the 8 images was made with a coil at a different location around the phantom, each location 45 degrees from the adjacent position.

A two-loop coil with canceling currents was tuned to 470 MHz. Adjustments were made in the simulator. The sensitivity profile was much "flatter" than a conventional surface coil and, therefore, it had better flip angles at depths within the field of view. A 2 liter bottle with brain equivalent solution was used as a phantom to take 8 images. Each image was made with the coil at a different location around the phantom, by rotating (by hand), the coil approximately 45 degrees between each image. The 8 images were added using a spectrometer, and a sum-of-squares reconstruction was performed as shown in FIG. 1.

EXAMPLE 2

Figure 3A:
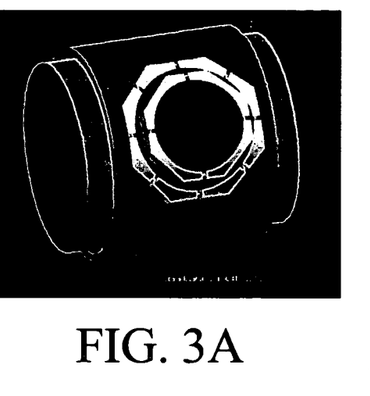
FIG. 3A shows the geometry of a simulation of a CRC coil placed on an acrylic cylinder used in Remcom's XFDTD, a finite difference time domain electromagnetic field simulator.
Figure 3B:
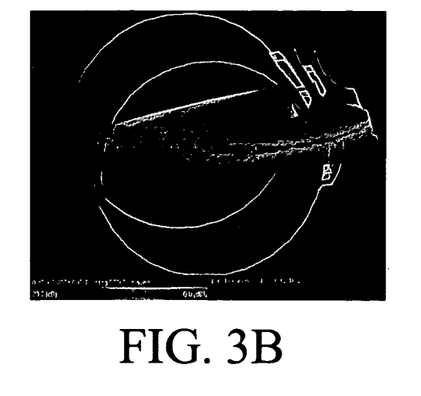
FIG. 3B shows the simulated transverse B1 field from the CRC loop shown in FIG. 3A, using Remcom's XFDTD.
Figure 4A:
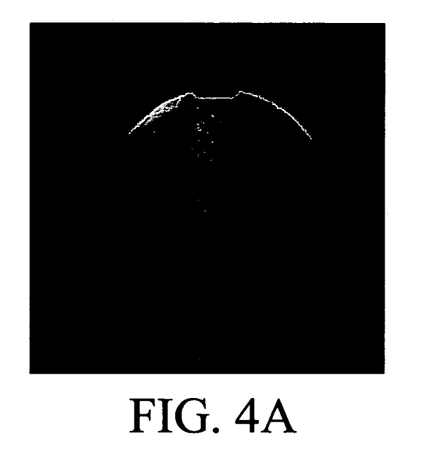
FIG. 4A shows, the zero degree image.
Figure 4B:
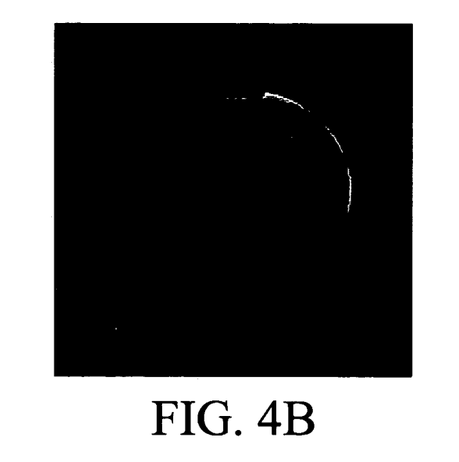
FIG. 4B shows the 45 degree image.
Figure 4C:
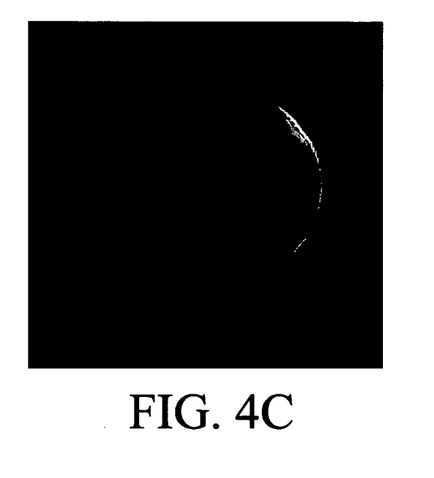
FIG. 4C shows the 90 degree image.
Figure 4D:
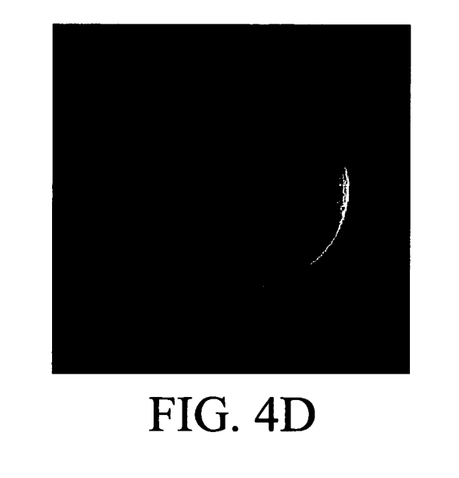
FIG. 4D shows the 135 degree image.
Figure 4E:
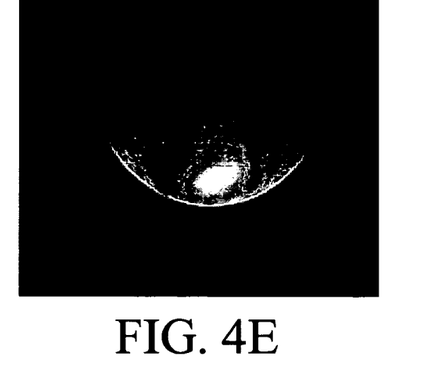
FIG. 4E shows the 180 degree image.
Figure 4F:
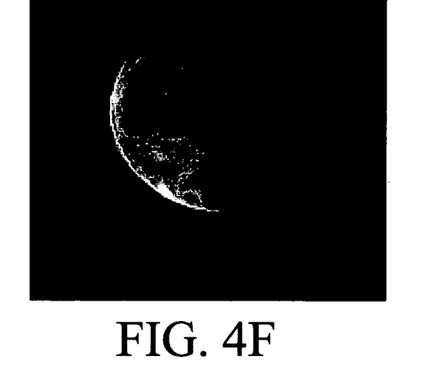
FIG. 4F shows the 225 degree image.
Figure 4G:
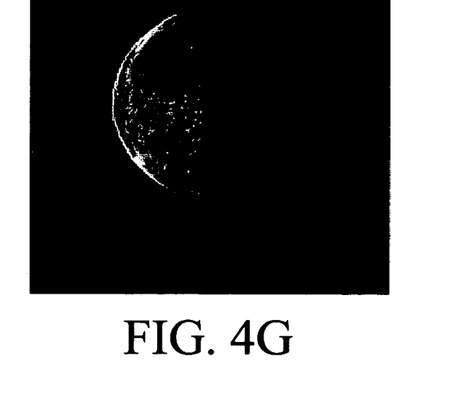
FIG. 4G shows the 270 degree image.
Figure 4H:
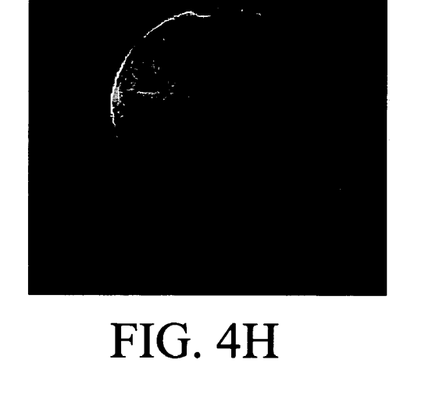
FIG. 4H shows the 315 degree image.

In this experiment, a local field was produced that did not excite modal behavior across the entire volume, but had a field at the center of the volume that was of the same order of magnitude as the field at the surface of the volume. An optimized CRC coil was chosen for this purpose (Vaughan et al., Magn Reson Med, 46: 24–30 (2001); Beck et al., Magn Reson Med, 51: 1103–1107 (2004)). The CRC coil was placed on an acrylic cylinder having a 15.3 cm (6") outer diameter. The outer loop had a diameter of 9 cm and the inner loop 6 cm. The inner loop was displaced vertically by 0.5 cm. The geometry is shown in FIG. 3A. The CRC was loaded with a large cylindrical phantom (2 L bottle, diameter 12 cm, height 20 cm) containing a tissue equivalent solution ($\in$=48.6, $\sigma$=0.6 S/m @470 MHz). The CRC was simulated using Remcom's XFDTD, a finite difference time domain electromagnetic field simulator. The Yee-cell was 1 mm on a side, the simulation space 180×195×240 cells, and 20,000 time-steps of 1.93 ps were performed. The simulated load had the same electrical properties as the 2 L bottle, but slightly different dimensions (diameter 12.5 cm, height 14 cm). The result of this simulation is shown in FIG. 3B.

Spin echo imaging was performed on an 11.1 Tesla, 40 cm Magnex clear bore magnet with a Bruker Biospec console. The spin echo parameters were: FOV 20 cm, matrix 256× 256, TR 200 ms, TE 10 ms, 1 average, 3 mm thick slice, and sweep width 50 KHz. The CRC coil was first placed at the top of the phantom, which was referenced as the 0° position. It was then rotated radially, in 45° increments, each time acquiring an image.

Results

Figure 5A:
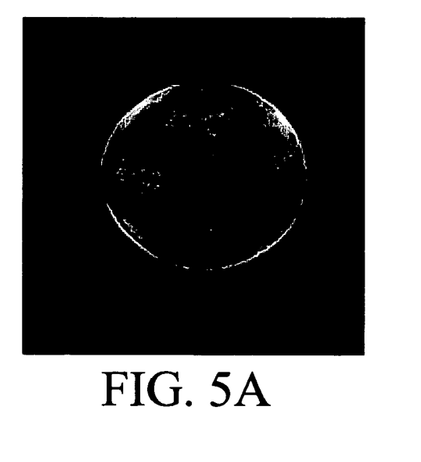
FIG. 5A shows the sum of four magnitudes images, namely the 0 degree image, the 90 degree image, the 180 degree image, and the 270 degree image.
Figure 5B:
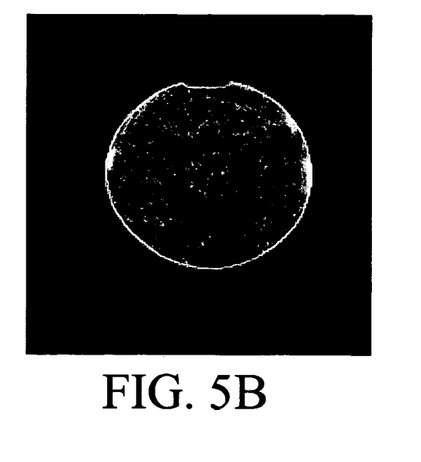
FIG. 5B shows the sum of the magnitudes images of the eight images shown in FIGS. 4A–4H.
Figure 6:
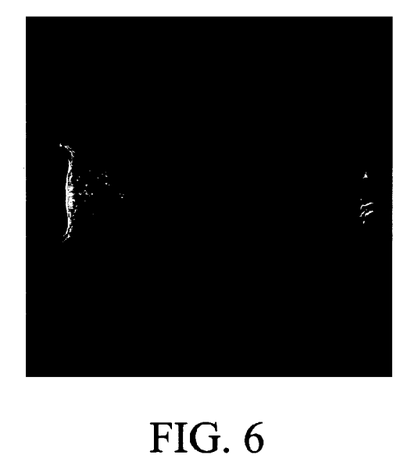
FIG. 6 shows a sagittal image of a 2 L phantom, acquired with multileg quadrature coil (Hoult, D.I. J. Magn. Reson. Imaging 12: 46–67, (2000)), where signal voids in center of image can be seen.

The eight images representing the images associated with each position around the sample are shown in FIGS. 4A–4H. Good depth penetration into the center of the phantom is achieved in every image. FIG. 5A is the sum of four magnitude images (0, 90, 180 and 270 degrees), while FIG. 5B is the sum of all eight magnitude images. No significant signal voids are present. In contrast, in FIGS. 6A and 6B, standard spin echo images acquired with a multi-leg volume coil driven in quadrature (Beck et al., Magn Reson Med, 51: 1103–1107 (2004)) have signal voids appearing throughout major portions of the field of view. In particular, the sagittal image of the 2L phantom, acquired with a multi-leg quadrature coil (Hoult, D.I. J. Magn. Reson. Imaging 12: 46–67, (2000)) shows noticeable signal voids in the center of the image, and the axial image through the same phantom using the same volume coil shows noticeable signal voids in the center and in an annular ring between the center and the outer region.

Figure 2:
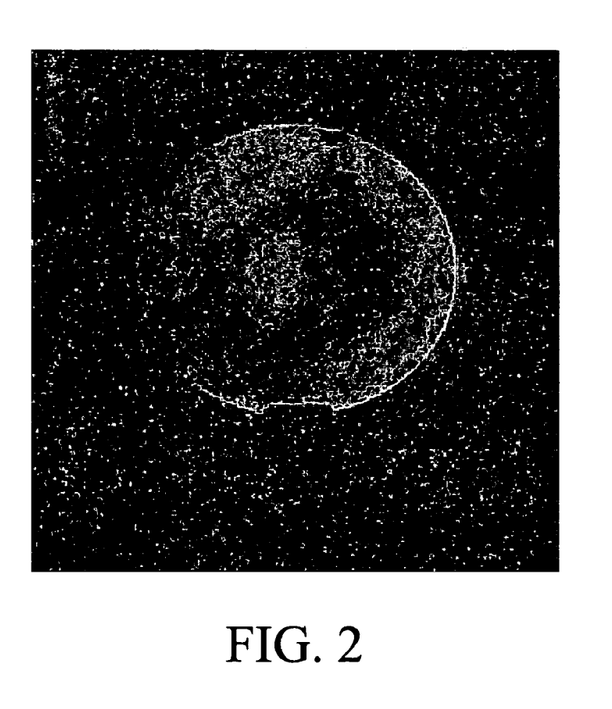
FIG. 2 shows an image based on a scan having the same parameters as the scan used for the image FIG. 1, using a RECAV volume coil except with 12 averages.
Figure 7:
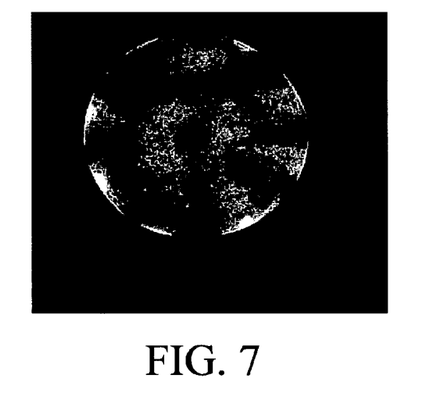
FIG. 7 shows an image from the product of the positively phased addition of all 8 rotations of FIGS. 4A–4H and the negatively phased addition of all 8 rotations shown in FIGS. 4A–4H.
Figure 8:
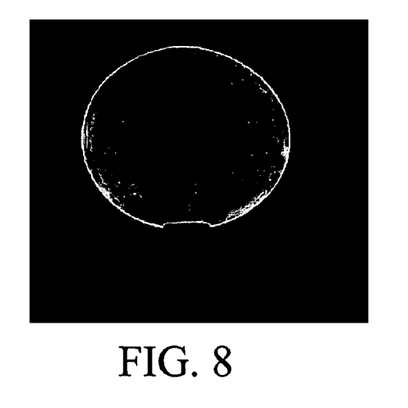
FIG. 8 shows the square root of the sum of the squares of all eight images shown in FIGS. 4A–4H.

In order to predict the appearance of a virtual volume coil that would utilize eight CRC loops combined with phases, analogous to a shielded birdcage/TEM coil current distribution, two intermediate images were constructed. The first was a complex sum of all eight images with a progressive +45 degrees. The second was a complex sum of all eight images with a progressive −45 degrees. FIG. 7 is the scaled product of these two images, or the scaled product of positively phased addition of all eight images and the negatively phased addition of all eight images. Comparison with FIG. 2 shows a similarity in gross areas of cancellation if local effects of the small loops are ignored. It is interesting to additionally note that each of the complex sum images produced significant cancellation, regardless of the direction of phase change. Accordingly, it appears separate acquisitions, if added with any particular fixed phase distribution, will produce a strong tendency to cancel signal at some locations. FIG. 8 shows the square root of the sum of the squares of all eight images. This provides the highest overall SNR, given the individual images (Roemer, et al, Magn Reson Med. (1990)).

The composite images, utilizing only the magnitude of each image, are much more homogeneous than that acquired by the traditional quadrature volume coil of the phased sum of the individual images. There does not appear to be any significant signal voids in FIG. 5B. The sum of eight is more homogeneous than the sum of four, with the trend indicating that more elements will produce an even more homogeneous image.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A method of magnetic resonance imaging, comprising:
    exciting a first portion of a field of view with a first at least one RF pulse from a first at least one RF coil element during a first portion of a period of time;
    exciting a second portion of the field of view with a second at least one RF pulse from a second at least one RF coil element during a second portion of the period of time, wherein the second portion of the field of view is different from the first portion of the field of view;
    detecting a corresponding at least one RF signal from the first portion of the field of view due to exciting the first portion of the field of view;
    detecting a corresponding at least one RF signal from the second portion of the field of view due to exciting the second portion of the field of view;

creating a first image from the corresponding at least one RF signal from the first portion of the field of view;

creating a second image from the corresponding at least one RF signal from the second portion of the field of view;

creating a composite image from the first image and the second image.

2. The method according to claim 1, wherein the pulse shape of the first at least one RF pulse is different from the pulse shape of the second at least one RF pulse.

3. The method according to claim 1, wherein the first at least one RF coil element is associated with a first mode of a coil configuration and the second at least one RF coil element is associated with a second mode of the coil configuration, wherein the coil configuration comprises the first at least one RF coil element and the second at least one RF coil element.

4. The method according to claim 1, wherein the width of the field of view is greater than $\lambda$, where $$\lambda \propto \frac{1}{f}\left(f\,(\mathrm{MHz}) = 42.6\frac{MH}{T}\right) \text{ and}$$

$$\lambda \propto \frac{1}{\sqrt{\varepsilon}} \; (\varepsilon \text{ is the dielectric constant of the sample to be imaged}).$$

wherein $\lambda$ is representative of the wavelengths in the sample to be imaged.

5. The method according to claim 1, wherein the width of the field of view is greater than $\lambda/2$, where $$\lambda \propto \frac{1}{f}\left(f\,(\mathrm{MHz}) = 42.6\frac{MH}{T}\right) \text{ and}$$

$$\lambda \propto \frac{1}{\sqrt{\varepsilon}} \; (\varepsilon \text{ is the dielectric constant of the sample to be imaged}).$$

wherein $\lambda$ is representative of the wavelengths in the sample to be imaged.

6. The method according to claim 1, wherein detecting a corresponding RF signal comprises detecting a corresponding RF signal produced by protons.

7. The method according to claim 1, wherein detecting a corresponding RF signal comprises detecting a corresponding RF signal produced by one or more of the following group: phosphorus, carbon, and fluorine.

8. The method according to claim 1, wherein creating a composite image comprises creating a composite image by adding the magnitudes of the first image and the magnitude of the second image for each pixel.

9. The method according to claim 1, wherein creating a composite image comprises creating a composite image by taking the square root of the sum of the magnitude squared for the first image and the magnitude squared for the second image for each pixel.

10. The method according to claim 1, wherein creating a composite image comprises creating a composite image by combining the values from the first image and the values from the second image in a way that the phase of the value of the first image and the phase of the value of the second image do not interact.

11. The method according to claim 1, wherein the first at least one RF coil element and the second at least one RF coil element share one or more RF coil elements.

12. The method according to claim 1, wherein the first at least one RF coil element and the second at least one RF coil element do not share any RF coil elements.

13. A method of magnetic resonance imaging, comprising:

exciting a plurality of portions of a field of view with a corresponding plurality of at least one RF pulse from a corresponding plurality of at least one RF coil element during a corresponding plurality of portions of a period of time, wherein each of the plurality of portions of the field of view is different from each of the other of the plurality of portions of the field of view;

detecting a corresponding plurality of at least one RF signal from the plurality of portions of the field of view due to exciting the plurality of portions of the field of view;

creating a corresponding plurality of images from the corresponding plurality of RF signals from the plurality of portions of the field of view;

creating a composite image from the plurality of images.

14. The method according to claim 13, wherein the at least one RF pulse of each of the plurality of at least one RF pulse are adjacent with each other in time.

15. The method according to claim 13, wherein the at least one RF pulse of each of the plurality of at least one RF pulse are interlaced in time.

16. The method according to claim 13, wherein detecting a corresponding at least one RF signal comprises detecting each RF signal from the corresponding portion of the field of view for at least $T_1$ seconds, where $T_1$ is the $T_1$ spin-lattice relaxation time constant of the sample.

17. The method according to claim 13, wherein detecting a corresponding at least one RF signal comprises detecting each RF signal from the corresponding portion of the field of view for at least T2 seconds, where $T_2$ is the $T_2$ spin-lattice relaxation time constant of the sample.

18. The method according to claim 13, wherein exciting a plurality of portions of a field of view with a corresponding plurality of at least one RF pulse from a corresponding plurality of at least one RF coil element comprises exciting a plurality of portions of a field of view with a corresponding plurality of at least one RF pulse from an RF coil element, wherein the RF coil element is repositioned for each of the at least one RF pulse of the plurality of at least one RF pulse.

19. The method according to claim 13, wherein exciting a plurality of portions of a field of a field of view comprises exciting a plurality of portions of a field of view in $B_0$ field greater than or equal to 3T.

20. The method according to claim 13, wherein exciting a plurality of portions of a field of view comprises exciting a plurality of portions of a field of view in $B_o$ field greater than or equal to 5T.

21. The method according to claim 13, wherein exciting a plurality of portions of a field of view comprises exciting a plurality of portions of a field of view in $B_o$ field greater than or equal to 7T.

22. The method according to claim 13, wherein exciting a plurality of portions of a field of view comprises exciting a plurality of portions of a field of view in $B_o$ field greater than or equal to 11 T.

23. The method according to claim 22, wherein detecting a corresponding RF signal comprises detecting a corresponding RF signal produced by one or more of the following group: phosphorus, carbon, and fluorine.

24. The method according to claim 22, wherein detecting a corresponding RF signal comprises detecting a corresponding RF signal produced protons.

25. The method according to claim 13, wherein a coil configuration comprises the plurality of at least one RF coil element, wherein detecting a corresponding plurality of at least one RF signal comprises detecting each RF signal with the coil configuration.

26. A method of magnetic resonance spectroscopy, comprising:
- exciting a first portion of a field of view with a first at least one RF pulse from a first at least one RF coil element during a first portion of a period of time;
- exciting a second portion of the field of view with a second at least one RF pulse from a second at least one RF coil element during a second portion of the period of time, wherein the second portion of the field of view is different from the first portion of the field of view;
- detecting a corresponding at least one RF signal from the first portion of the field of view due to exciting the first portion of the field of view;
- detecting a corresponding at least one RF signal from the second portion of the field of view due to exciting the second portion of the field of view;
- creating a first spectrum from the corresponding at least one RF signal from the first portion of the field of view;
- creating a second spectrum from the corresponding at least one RF signal from the second portion of the field of view;
- creating a composite spectrum from the first spectrum and the second spectrum.

27. An apparatus for magnetic resonance imaging, comprising:
- a means for exciting a first portion of a field of view with a first at least one RF pulse from a first at least one RF coil element during a first portion of a period of time;
- a means for exciting a second portion of the field of view with a second at least one RF pulse from a second at least one RF coil element during a second portion of the period of time, wherein the second portion of the field of view is different from the first portion of the field of view;
- a means for detecting a corresponding at least one RF signal from the first portion of the field of view due to exciting the first portion of the field of view;
- a means for detecting a corresponding at least one RF signal from the second portion of the field of view due to exciting the second portion of the field of view;
- a means for creating a first image from the corresponding at least one RF signal from the first portion of the field of view;
- a means for creating a second image from the corresponding at least one RF signal from the second portion of the field of view;
- a means for creating a second image from the first image and the second image.

28. An apparatus for magnetic resonance imaging, comprising:
- a means for exciting a plurality of portions of a field of view with a corresponding plurality of at least one RF pulse from a corresponding plurality of at least one RF coil element during a corresponding plurality of portions of a period of time, wherein each of the plurality of portions of the field of view is different from each of the other of the plurality of portions of the view;
- a means for detecting a corresponding plurality of at least on RF signal from the plurality of portions of the field of view due to exciting the plurality of portions of the field of view;
- a means for creating a corresponding plurality of images from the corresponding plurality of RF signals from the plurality of portions of the field of view;
- a means for creating a composite image from the plurality of images.

29. An apparatus for magnetic resonance spectroscopy, comprising:
- a means for exciting a first portion of a field of view with a first at least one RF pulse from a first at least one RF coil element during a first portion of a period of time;
- a means for exciting a second portion of the field of view with a second at least one RF pulse from a second at least one RF coil element during a second portion of the period of time, wherein the second portion of the field of view is different from the first portion of the field of view;
- a means for detecting a corresponding at least one RF signal from the first portion of the field of view due to exciting the first portion of the field of view;
- a means for detecting corresponding at least one RF signal from the second portion of the field of view due to exciting the second portion of the field of view;
- a means for creating a first spectrum from the corresponding at least one RF signal from the first portion of the field of view;
- a means for creating a second spectrum from the corresponding at least one RF signal from the second portion of the field of view;
- a means for creating a composite spectrum from the first spectrum and the second spectrum.

\* \* \* \* \*

UNITED STATES PATENT AND TRADEMARK OFFICE
CERTIFICATE OF CORRECTION

PATENT NO. : 7,166,999 B2
APPLICATION NO. : 11/074964
DATED : January 23, 2007
INVENTOR(S) : G. Randy Duensing Page 1 of 1

It is certified that error appears in the above-identified patent and that said Letters Patent is hereby corrected as shown below:

Column 3,
Line 64, "Additional, techniques" should read --Additionally, techniques--.

Column 7,
Line 55, "1 average" should read --1 average--.

Column 10,
Line 60, "equal to 11 T." should read --equal to 11T.--.

Column 10,
Lines 66-67, "a corresponding RF signal produced protons" should read
--a corresponding RF signal produced by protons--.

Column 12,
Line 12, "of the view" should read --of the field of view--.

Signed and Sealed this

Fourteenth Day of August, 2007

JON W. DUDAS
*Director of the United States Patent and Trademark Office*